(12) United States Patent
Kim et al.

(10) Patent No.: US 9,076,539 B2
(45) Date of Patent: Jul. 7, 2015

(54) COMMON SOURCE SEMICONDUCTOR MEMORY DEVICE

(71) Applicant: Samsung Electronics Co., Ltd.

(72) Inventors: Chan-Kyung Kim, Hwaseong-si (KR); Dong-Min Kim, Hwaseong-si (KR); Hong-Sun Hwang, Suwon-si (KR)

(73) Assignee: SAMSUNG ELECTRONICS CO., LTD., Yeongtong-gu, Suwan-si, Gyeonggi-do (KR)

( * ) Notice: Subject to any disclaimer, the term of this patent is extended or adjusted under 35 U.S.C. 154(b) by 12 days.

(21) Appl. No.: 14/105,782

(22) Filed: Dec. 13, 2013

(65) Prior Publication Data

US 2014/0169086 A1 Jun. 19, 2014

(30) Foreign Application Priority Data

Dec. 14, 2012 (KR) .......................... 10-2012-0145974

(51) Int. Cl.
G11C 11/16 (2006.01)

(52) U.S. Cl.
CPC .................................... G11C 11/161 (2013.01)

(58) Field of Classification Search
None
See application file for complete search history.

(56) References Cited

U.S. PATENT DOCUMENTS

| | | | |
|---|---|---|---|
| 7,742,329 B2 | 6/2010 | Yoon et al. | |
| 7,974,121 B2 | 7/2011 | Li et al. | |
| 8,264,888 B2 | 9/2012 | Choi et al. | |
| 8,446,769 B2 | 5/2013 | Kim | |
| 2004/0008557 A1* | 1/2004 | Perner et al. | ................... 365/211 |
| 2007/0109840 A1 | 5/2007 | Gogl | |
| 2011/0269251 A1 | 11/2011 | Kim et al. | |

FOREIGN PATENT DOCUMENTS

| | | |
|---|---|---|
| KR | 2004-0021389 A | 3/2004 |
| KR | 1004506 B1 | 12/2010 |
| KR | 2011-0027435 A | 3/2011 |
| KR | 2011-0089729 A | 8/2011 |

* cited by examiner

Primary Examiner — James G Norman
(74) Attorney, Agent, or Firm — Muir Patent Law, PLLC

(57) ABSTRACT

A memory device includes a cell array and a common source line compensation circuit. The cell array includes a plurality of normal cell units connected between a plurality of bit lines and one common source line, respectively. The common source line compensation circuit supplies a plurality of compensation write currents to the common source line to compensate for a plurality of write currents concurrently input into or output from the common source line through the normal cell units.

19 Claims, 14 Drawing Sheets

COMMON SOURCE SEMICONDUCTOR MEMORY DEVICE

CROSS-REFERENCE TO RELATED APPLICATION

This application claims priority under 35 USC §119 to Korean Patent Application No. 10-2012-0145974, filed on Dec. 14, 2012, in the Korean Intellectual Property Office (KIPO), the contents of which are herein incorporated by reference in their entirety.

BACKGROUND

The present disclosure relates generally to a common source semiconductor memory device.

Semiconductor memory devices are mainly classified into a volatile memory device, such as a DRAM or an SRAM, and a nonvolatile memory device, such as a ROM or a flash memory.

The nonvolatile memory device can preserve data even if power supply is shut off. As the memory technology has been developed, the data stored in the nonvolatile memory device may be permanent or reprogrammable. Thus, the nonvolatile memory device is used in various industrial fields, such as computers, avionics, communication and consumer electronic technology industries, to preserve the program and microcode even when the power supply is shut off.

Next-generation memory devices of nonvolatile memory devices are attempting to combine the high integration degree of the DRAM (Dynamic Random Access Memory), the non-volatile property of the flash memory, and the high speed response of the SRAM (Static RAM). Recently, a PRAM (Phase change RAM), an NFGM (Nano Floating Gate Memory), a PoRAM (Polymer RAM), an MRAM (Magnetic RAM), a FeRAM (Ferroelectric RAM), and an RRAM (Resistive RAM) have been discussed as next-generation memory devices suitable for the above characteristics.

In particular, studies are currently being carried out for high-speed and large-capacity nonvolatile memory devices using a resistance material, such as an MRAM (Magnetic Random Access Memory), a PRAM (Phase change Random Access Memory) and an RRAM (Resistive RAM). Among MRAMs, an STT-MRAM (Spin Torque Transfer-Magnetic Random Access Memory) is a multifunctional memory device having the characteristics of the low cost and high capacity of the DRAM, the high-speed operation of the SRAM and the nonvolatile property of the flash memory.

According to the STT-MRAM write operation, a bidirectional current having a value at or above a threshold is applied to a cell unit in order to carry out a data program for the cell unit. In addition, in order to implement performance corresponding to a write bandwidth of a DRAM, a system is configured to concurrently use X8 or X16 data upon the opening of one common source line (CSL). In this case, the amount of current flowing in one direction or the other direction is determined according to the pattern of X8 and X16 data. As a result, the current is output from or input into the common source line and noise voltage induced to the common source line may be changed according to the data pattern based on the resistance value of the common source line. Therefore, in order to provide for a more stable STT-MRAM operation, the voltage of the common source line, which is the reference voltage, should be appropriately supplied over the whole area of the cell array with minimal or no noise.

SUMMARY

Some example embodiments provide a semiconductor memory device capable of removing noise of a common source line according to the data pattern.

According to one example embodiment, a memory device includes a cell array and a common source line compensation circuit. The cell array includes a plurality of normal cell units connected between a plurality of bit lines and one common source line, respectively. The common source line compensation circuit supplies a plurality of compensation write currents to the common source line to compensate for a plurality of write currents concurrently input into or output from the common source line through the normal cell units.

In example embodiments, the common source line compensation circuit may include a compensation input buffer configured to invert input write data supplied from an outside, a compensation write circuit configured to concurrently supply the compensation write currents, which correspond to each bit value of the write data inverted through the compensation input buffer, to corresponding compensation bit lines, and a plurality of compensation cell units disposed in an area of the cell array and connected between the compensation bit lines and the common source line, respectively, to concurrently store data corresponding to the compensation write currents.

The write data may have a bit number of 2 square including x2, x4, x8, x32, x64 or x128.

Each cell unit of the normal cell units and of the compensation cell units may include a variable resistance memory element and a cell access transistor serially connected between a corresponding bit line and the common source line.

The variable resistance memory element may include an STT-MTJ (Magnetic Tunnel Junction) memory element where data are recorded by an STT (Spin Transfer Torque).

A normal input buffer and the compensation input buffer to input the write data may include a plurality of pseudo differential amplifiers, respectively.

The compensation cell units may include dummy cell units dedicated for use as compensation cell units. On the other hand, in another embodiment, the compensation cell units may be formed by a part of the normal cell units, such that they are configured for use as compensation cell units and as normal cell units.

The semiconductor memory device may further include a compensation mode selection circuit between the compensation write circuit and the compensation bit lines, and the compensation mode selection circuit may selectively supply a normal write current and the compensation write current to the compensation cell units through a column decoder, which is used to select the compensation bit lines, in response to a compensation mode selection signal.

The compensation mode selection circuit may include a compensation mode set register configured to store a compensation mode set signal and to generate a compensation mode selection signal, an inverter configured to invert the compensation mode selection signal, a first selection switch connected between the column decoder and the compensation bit lines and turned on in a normal mode in response to the compensation mode selection signal, and a second selection switch connected between the compensation write circuit and the compensation bit lines and turned on in a compensation mode in response to an output signal of the inverter.

According to one example embodiment, a semiconductor memory device includes a row decoder, a column decoder, a cell array, a normal input buffer, a normal write circuit, and a common source line compensation circuit. The row decoder selects one of a plurality of word lines. The column decoder concurrently selects bit lines corresponding to n-bit data, n being an integer greater than 1. The cell array includes respective cells disposed at respective intersections between the word lines and the bit lines and includes a plurality of normal cell units connected between a corresponding bit line and one common source line, respectively. The normal input buffer inputs the n-bit data. The normal write circuit drives bit lines of a column selected by the column decoder with a corresponding write current in response to a data pattern input into the normal input buffer. The common source line compensation circuit supplies a plurality of compensation write currents to the common source line to compensate for a plurality of write currents concurrently input into or output from the common source line through the normal cell units concurrently driven through the normal write circuit by inputting the n bit data.

In example embodiments, the common source line compensation circuit may include a compensation input buffer configured to invert the n bit data and output the inverted n-bit data, a compensation write circuit configured to concurrently supply the compensation write currents, which correspond to each bit value of the n-bit data inverted through the compensation input buffer, to corresponding compensation bit lines, and a plurality of compensation cell units disposed in an area of the cell array and connected between the compensation bit lines and the common source line, respectively, to concurrently store data corresponding to the compensation write currents.

The semiconductor memory device may further include a compensation mode selection circuit between the compensation write circuit and the compensation bit lines, and the compensation mode selection circuit may selectively supply a normal write current and the compensation write current to the compensation cell units through a column decoder, which is used to select the compensation bit lines, in response to a compensation mode selection signal.

The compensation mode selection circuit may include a compensation mode set register configured to store a compensation mode set signal and to generate a compensation mode selection signal, an inverter configured to invert the compensation mode selection signal, a first selection switch connected between the column decoder and the compensation bit lines and turned on in a normal mode in response to the compensation mode selection signal, and a second selection switch connected between the compensation write circuit and the compensation bit lines and turned on in a compensation mode in response to an output signal of the inverter.

Each of the normal cell units and the compensation cell units may include a variable resistance memory element and a cell access transistor serially connected between a corresponding bit line and the common source line, and the variable resistance memory element may include an STT-MTJ (Magnetic Tunnel Junction) memory element where data are recorded by an STT (Spin Transfer Torque).

In one embodiment, a magnetic random access memory (MRAM) device includes: a memory cell array including a plurality of cell units arranged in rows and columns; a plurality of first buffer circuits, each first buffer circuit coupled between a pad of the MRAM device and a common source line and corresponding to a set of cell units of the plurality of cell units; and a plurality of second buffer circuits, each second buffer circuit coupled between a pad of the MRAM device and the common source line and corresponding to a set of cell units of the plurality of cell units. The MRAM device is configured to apply a current resulting from outputs of the plurality of second buffer circuits to the common source line, wherein the current balances a current concurrently applied to the common source line by the plurality of first buffer circuits.

In one embodiment, the plurality of first buffer circuits are connected to the same respective pads as the plurality of second buffer circuits, the plurality of first buffer circuits are configured to output a first set of data, and the plurality of second buffer circuits are configured to output a second set of data that is an inverse of the first set of data.

In one embodiment, the sets of cell units that correspond to the plurality of first buffer circuits are normal memory cell units, and the sets of cell units that correspond to the plurality of second buffer circuits are configured function as either normal memory cell units or compensation cell units.

In one embodiment, a mode selection circuit between the plurality of second buffer circuits and common source line is configured to select between setting the sets of cell units that correspond to the plurality of second buffer circuits as normal memory cell units, and setting the sets of cell units that correspond to the plurality of second buffer circuits as compensation cell units.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
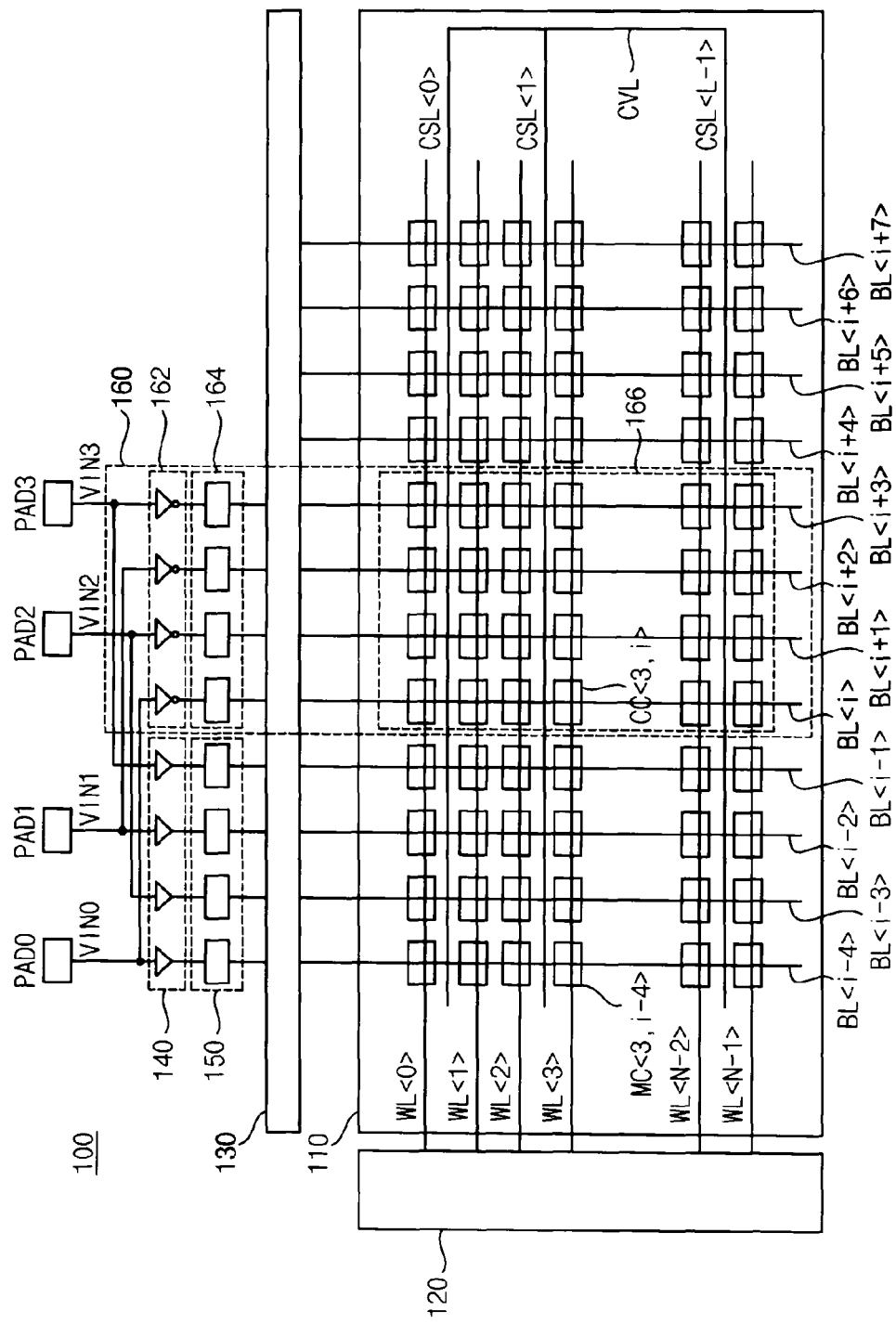
FIG. 1 is a block diagram illustrating a semiconductor memory device according to example embodiments.

Various example embodiments will be described more fully with reference to the accompanying drawings, in which some example embodiments are shown. The present inventive concept may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the disclosed embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The disclosed embodiments relate to a common source semiconductor memory device, and more particularly to a common source semiconductor memory device capable of reducing common source noise according to a data pattern input upon the concurrent write operation of a plurality of bit data.

FIG. 1 is a block diagram illustrating a semiconductor memory device according to example embodiments.

Referring to FIG. 1, the semiconductor memory device 100 includes a cell array 110, a row decoder 120, a column decoder 130, a normal input buffer 140, a normal write circuit 150 and a common source line compensation circuit 160.

In one example embodiment, the semiconductor memory device 100 is configured to input/output 4 bit data for the purpose of convenience of explanation, but the semiconductor memory device 100 can be used to input/output X8, X16 or X32 data.

The common source line compensation circuit 160 includes a compensation input buffer 162, a compensation write circuit 164 and a plurality of compensation cell units 166.

The cell array 110 includes a plurality of cell units, also referred to as cells, connected to intersections between bit lines BL<i−4> to BL<i+7> and word lines WL<0> to WL<N−1>. Common source lines CSL<0>, CSL<1>, . . . and CSL<L−1> are disposed between two word lines (WL<0> and WL<1>), (WL<2> and WL<3>), . . . and (WL<N−2> and WL<N−1>), and the common source lines CSL<0>, CSL<1>, . . . and CSL<L−1> are electrically connected with each other through a common vertical line CVL. Such a common source line structure satisfies a size of $6F^2$ ($=2F*3F$) per a cell.

In one embodiment, compensation cell units CC(<i,j>) 166 are disposed at the center of the word line direction and normal cell units MC<i,j> are disposed to the left and right of the compensation cell units CC(<i,j>) 166. Such a layout of the compensation cell units may be used to minimize deviation upon the spatial layout of the cells. Thus, the spatial layout of the compensation cell units CC(<i,j>) 166 may be located to the left edge or the right edge within the range of the maximum allowable deviation. In addition, the compensation cell units CC(<i,j>) 166 may be equidistantly disposed in the word line direction in the cell array space.

Therefore, the storage space of the cell array 110 of the semiconductor memory device 100 is configured as N*(M+4), where M is the number of columns of normal cell units. In this case, the storage space actually usable by the user (e.g., for storing user data) is given as N*M storage space including normal cell units (also referred to herein as memory cell units or normal memory cell units).

The compensation cell units 166 of the above example embodiment may be formed in a unit of storage space using the common source line, for instance, in the unit of a MAT.

Different from the normal input buffer 140, which buffers each bit of 4-bit data input through four pads PAD0 to PAD3, The compensation input buffer 162 of the common source line compensation circuit 160 buffers the inverted complementary value.

Figure 2:
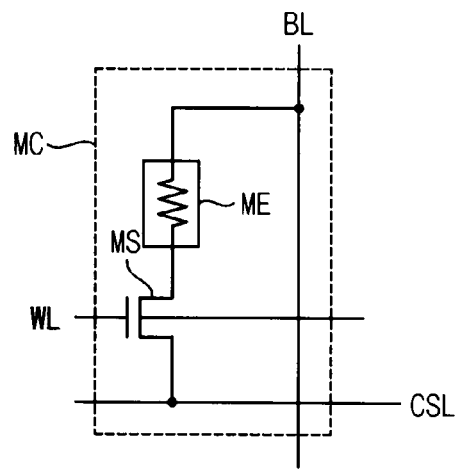
FIG. 2 is a view illustrating an equivalent circuit of a cell unit of a cell array shown in FIG. 1 according to an example embodiment.
Figure 3:
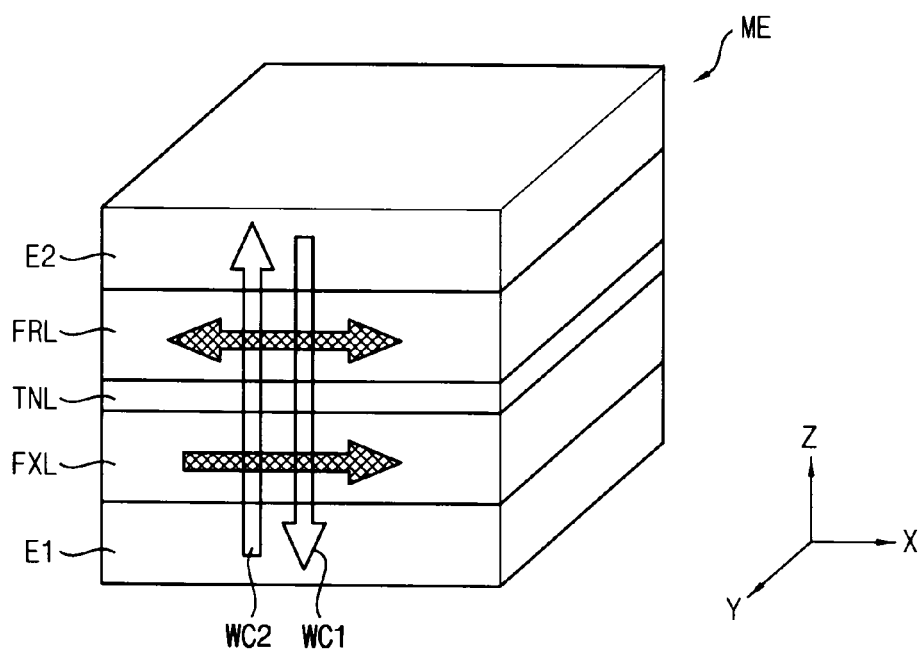
FIG. 3 is a perspective view illustrating a variable resistance memory element of a cell unit shown in FIG. 2 according to an example embodiment.

FIG. 2 is a view illustrating an equivalent circuit of the cell unit of the cell array shown in FIG. 1 according to an example embodiment, and FIG. 3 is a perspective view illustrating a variable resistance memory element of the cell unit shown in FIG. 2 according to an example embodiment.

Referring to FIG. 2, the cell unit MC includes a variable resistance memory element ME, which is serially connected to the bit line BL and the common source line CSL, and a cell access transistor MS. The cell access transistor MS is prepared as a MOS transistor having a gate to which the word line WL is connected. The cell access transistor MS may be disposed between (e.g., physically and/or electrically connected between, and/or located in the circuit between) the variable resistance memory element ME and the common source line CSL.

As shown in FIG. 3, the variable resistance memory element ME may include an STT-MTJ (Magnetic Tunnel Junction) element where data are recorded by STT (spin transfer torque). The STT-MTJ element ME may include a fixing layer FXL, a free layer FRL and a tunnel layer TNL interposed between the fixing layer FXL and the free layer FRL. The magnetization direction of the fixing layer FXL may be fixed, for instance, in the X-axis direction. In addition, the magnetization direction of the free layer FRL may be set in the X-axis direction or the inverse direction of the X-axis direction depending on the condition. A first electrode E1 is provided in contact with the fixing layer FXL and a second electrode E2 is provided in contact with the free layer FRL. The first electrode E1 is connected to the bit line BL of FIG. 2 and the second electrode E2 is connected to the common source line CSL of FIG. 2 (e.g., through the cell access transistor MS).

For instance, the fixing layer FXL, the tunnel layer TNL, the free layer FRL and the second electrode E2 may be sequentially provided on the first electrode E1. Although not shown in the drawings, an element to fix the magnetization direction of the fixing layer FXL, such as an anti-ferromagnetic layer, may be further provided between the first electrode E1 and the fixing layer FXL. The first and second electrodes E1 and E2 may be prepared as wires. In this case, the first and second electrodes E1 and E2 may be parallel, and may be vertically stacked in relation to each other. Write currents WC1 and WC2 may be applied between the first and second electrodes E1 and E2. The magnetization direction of the free layer FRL may be determined according to the direction of the write currents WC1 and WC2. For instance, if the first write current WC1 is applied from the second electrode E2 to the first electrode E1, the free layer FRL may be magnetized in the magnetization direction of the fixing layer FXL. In more detail, electrons migrate from the first electrode E1 to the second electrode E2 due to the first write current WC1. At this time, the electrons having the spin direction the same as that of the fixing layer FXL may apply torque to the free layer FRL. Thus, the free layer FRL may be magnetized in the magnetization direction of the fixing layer FXL. If the second write current WC2 is applied from the first electrode E1 to the second electrode E2, the free layer FRL may be magnetized in the direction opposite to the magnetization direction of the fixing layer FXL. As such, the electrons migrate from the first electrode E1 to the second electrode E2 due to the write current WC2, and the electrons having the spin direction opposite to that of the fixing layer FXL may return to the free layer FRL and apply torque to the free layer FRL. In this manner, the magnetization direction of the free layer FRL in the STT-MTJ element ME may be changed by the spin transfer torque. If the magnetization direction of the free layer FRL is identical to the magnetization direction (that is, the right direction) of the fixing layer FXL, the STT-MTJ element ME may have a low resistance value. In addition, when the magnetization direction of the free layer FRL is opposite to the magnetization direction of the fixing layer FXL (that is, the left direction), the STT-MTJ element ME may have a high resistance value. In one embodiment, the STT-MTJ element ME having the low resistance value corresponds to data '0' and the STT-MTJ element ME having the high resistance value corresponds to data '1'.

Figure 4:
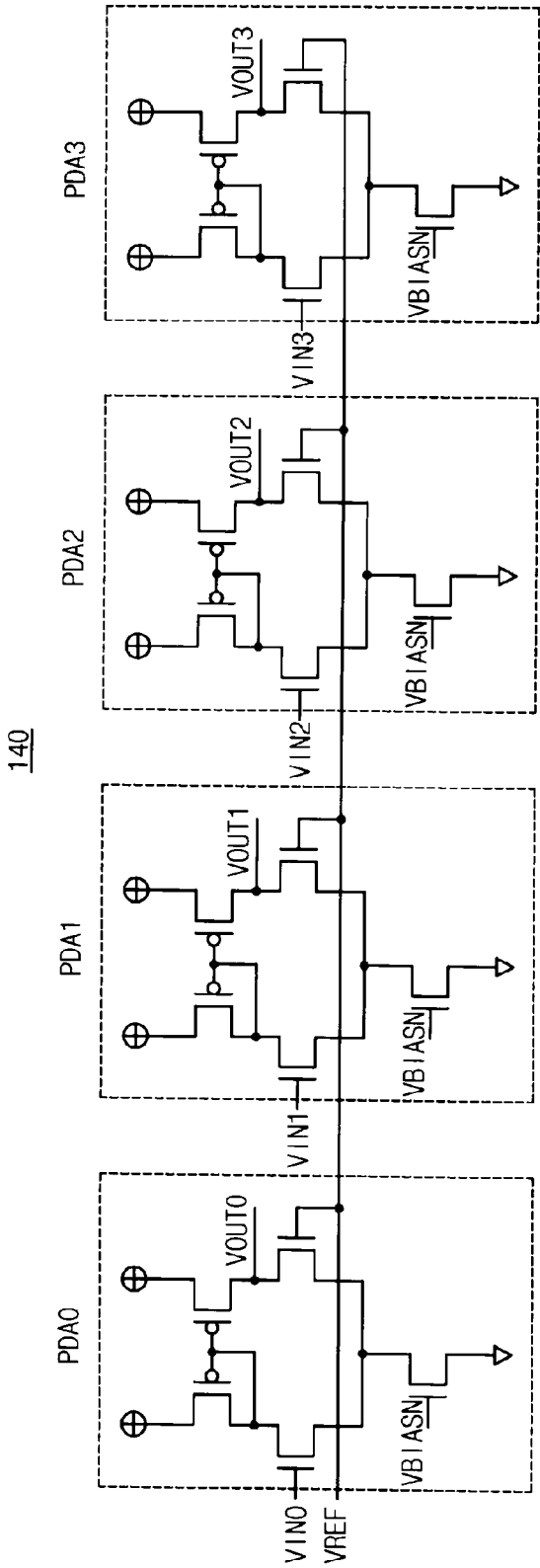
FIG. 4 is a circuit diagram illustrating a normal input buffer of FIG. 1 according to an example embodiment.
Figure 5:
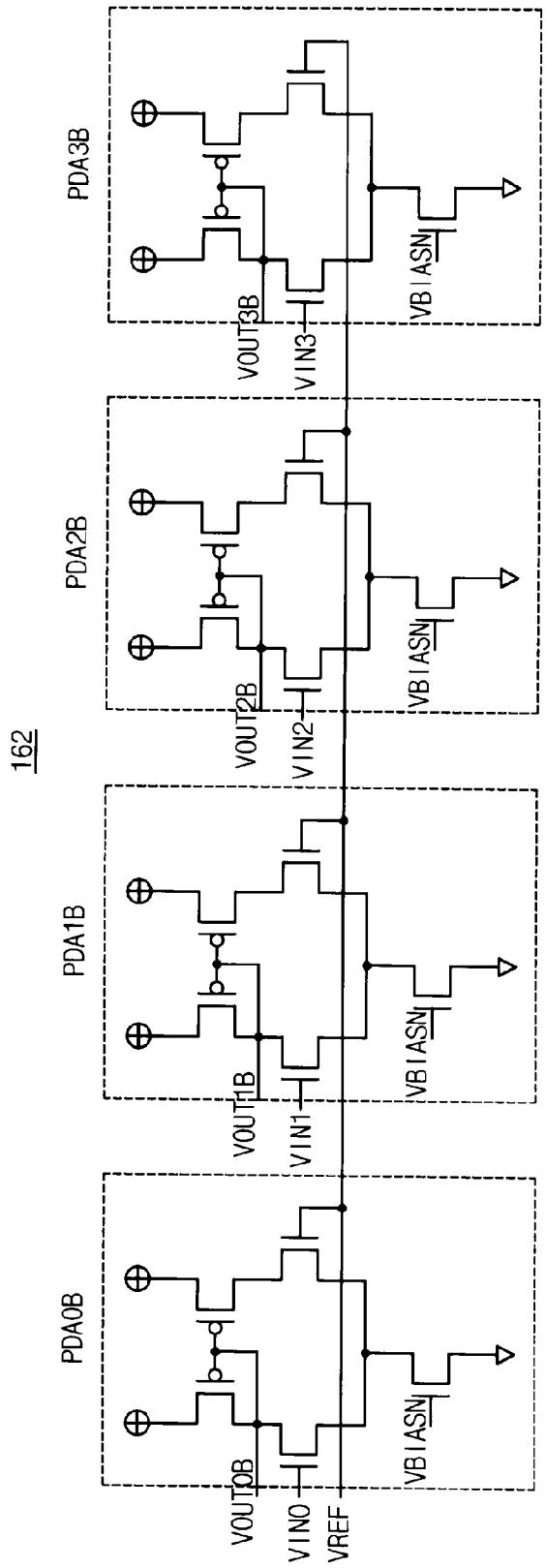
FIG. 5 is a circuit diagram illustrating a compensation input buffer of FIG. 1 according to an example embodiment.

FIG. 4 is a circuit diagram illustrating the normal input buffer 140 of FIG. 1 according to an example embodiment and FIG. 5 is a circuit diagram illustrating the compensation input buffer 162 of FIG. 1 according to an example embodiment.

The normal input buffer 140 includes four pseudo differential amplifiers PDA0 to PDA3. Data bit signals VIN0 to VIN3 input from the pads PAD0 to PAD3 are input into one input terminal of each of the four pseudo differential amplifiers PDA0 to PDA3 and a reference voltage signal VREF is commonly input into the other input terminal of each of the four pseudo differential amplifiers PDA0 to PDA3. The pseudo differential amplifiers PDA0 to PDA3 amplify difference of two input signals to output the output signals VOUT0 to VOUT3 to non-inverting output terminals, respectively. The pseudo differential amplifiers described herein may be referred to more generally as input buffer circuits, or just buffer circuits. As shown in FIGS. 1, 4, and 5, the normal input buffer 140 may include a plurality of first buffer circuits, and the compensation input buffer 162 may include a plurality of second buffer circuits. Each buffer circuit may correspond to a set of cell units of the cell array 110 (e.g., it may be coupled to a column of cell units), and each pad PAD0, PAD1, PAD2, or PAD3 may connect to one first buffer circuit of the normal input buffer 140 and one second buffer circuit of the compensation input buffer 162. Each buffer circuit may be coupled between a pad and a common source line.

The compensation input buffer 162 includes four pseudo differential amplifiers PDA0B to PDA3B. Data bit signals VIN0 to VIN3 input from the pads PAD0 to PAD3 are input into one input terminal of each of the four pseudo differential amplifiers PDA0B to PDA3B and a reference voltage signal VREF is commonly input into the other input terminal of each of the four pseudo differential amplifiers PDA0B to PDA3B. The pseudo differential amplifiers PDA0B to PDA3B amplify a difference of two input signals to output the output signals VOUT0B to VOUT3B to inverting output terminals, respectively.

Figure 6:
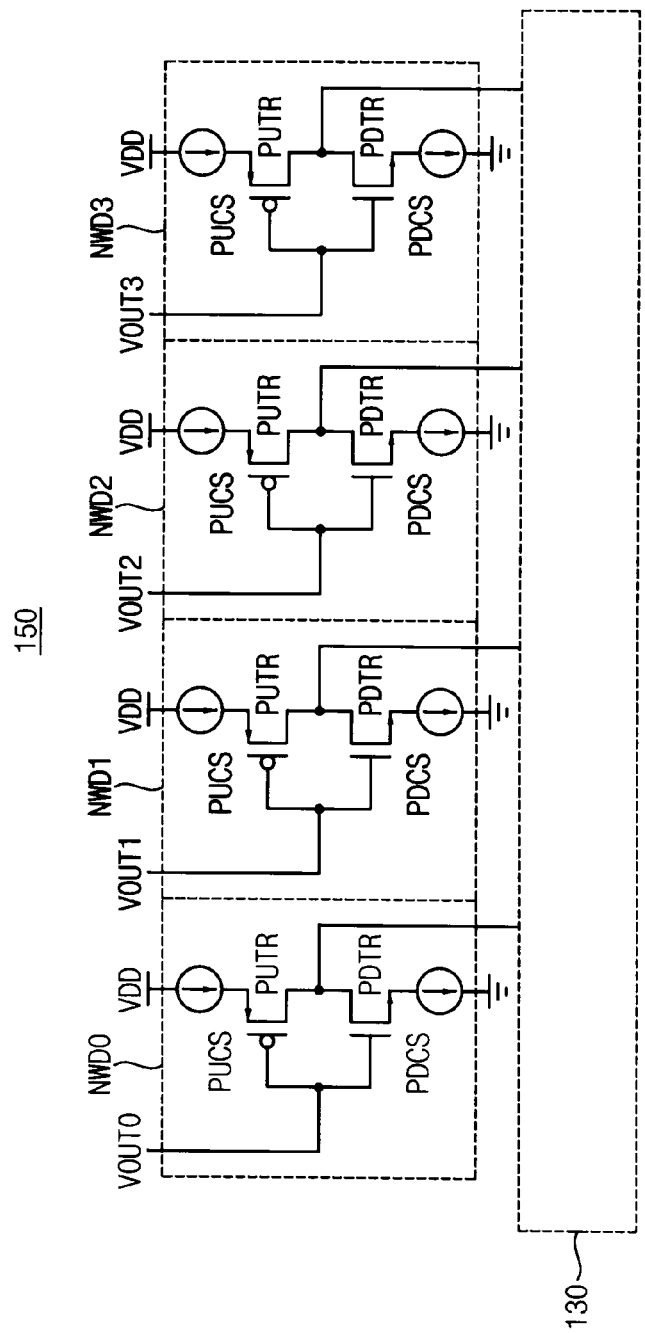
FIG. 6 is a circuit diagram illustrating a normal write circuit of FIG. 1 according to an example embodiment.
Figure 7:
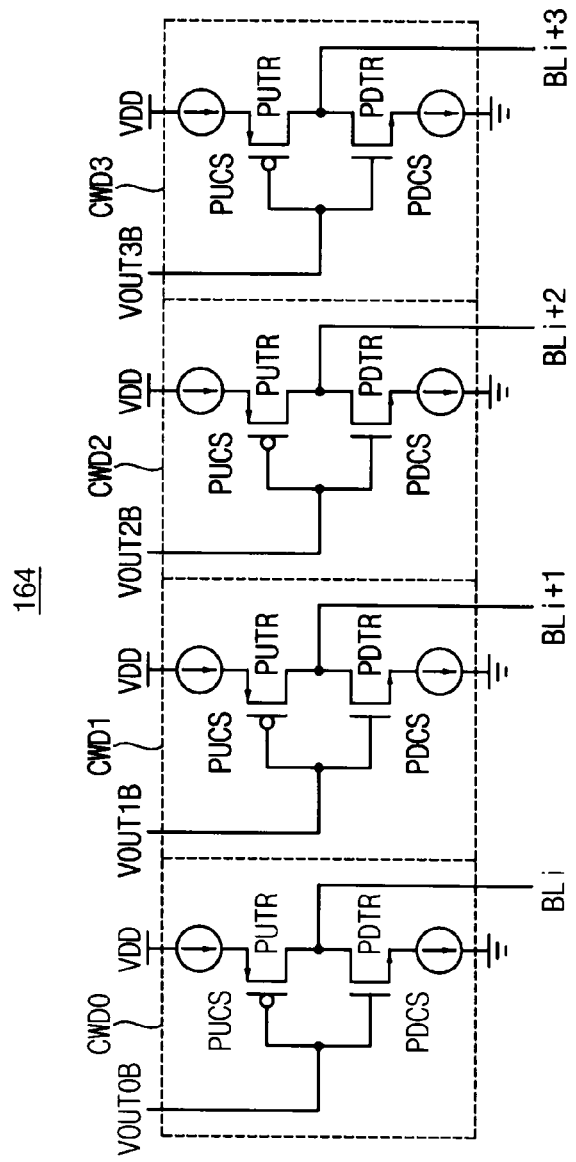
FIG. 7 is a circuit diagram illustrating a compensation write circuit of FIG. 1 according to an example embodiment.

FIG. 6 is a circuit diagram illustrating the normal write circuit of FIG. 1 according to an example embodiment and FIG. 7 is a circuit diagram illustrating the compensation write circuit of FIG. 1 according to an example embodiment.

Each of four normal write drivers NWD0, NWD1, NWD2 and NWD3 of the normal write circuit 150 may include a pull up current source PUSC, a pull up transistor PUTR, a pull down current source PDCS and a pull down transistor PDTR. Thus, output signals VOUT0, VOUT1, VOUT2 and VOUT3 of the normal input buffer 140 are input into the normal write circuit 150.

If the state of the input signal is data "0", the pull up transistor PUTR including a PMOS transistor is turned on so that the write current supplied from the pull up current source PUSC is output to the bit line selected through the column decoder 130.

If the state of the input signal is data "1", the pull down transistor PDTR including an NMOS transistor is turned on so that the current supplied to the bit line selected through the column decoder 130 is grounded through the pull down current source PDCS.

Therefore, the bit line selected by the column decoder 130 is driven with the write current having the opposite current direction in response to the state of input data.

Referring to FIG. 7, the compensation write circuit 164 includes four compensation write drivers CWD0, CWD1, CWD2 and CWD3. The four compensation write drivers CWD0, CWD1, CWD2 and CWD3 have the circuit structure the same as that of the four normal write drivers NWD0, NWD1, NWD2 and NWD3 of the normal write circuit 150.

Each of the four compensation write drivers CWD0, CWD1, CWD2 and CWD3 of the compensation write circuit 164 may include a pull up current source PUSC, a pull up transistor PUTR, a pull down current source PDCS and a pull down transistor PDTR. Thus, output signals VOUT0B, VOUT1B, VOUT2B and VOUT3B of the compensation input buffer 162 are input into the compensation write circuit 164. In one embodiment, the output of the four compensation write drivers CWD0, CWD1, CWD2 and CWD3 may be directly transferred to bit lines BLi, BLi+1, BLi+2 and BLi+3 without passing through the column decoder 130.

Therefore, since the signal having the inverted phase as compared with the signal input into the normal write signal 150 is input into the compensation write circuit 164, four current signals output from the four compensation write drivers CWD0, CWD1, CWD2 and CWD3 may have flow directions opposite to flow directions of current signals output from the four normal write drivers NWD0, NWD1, NWD2 and NWD3.

Figure 8:
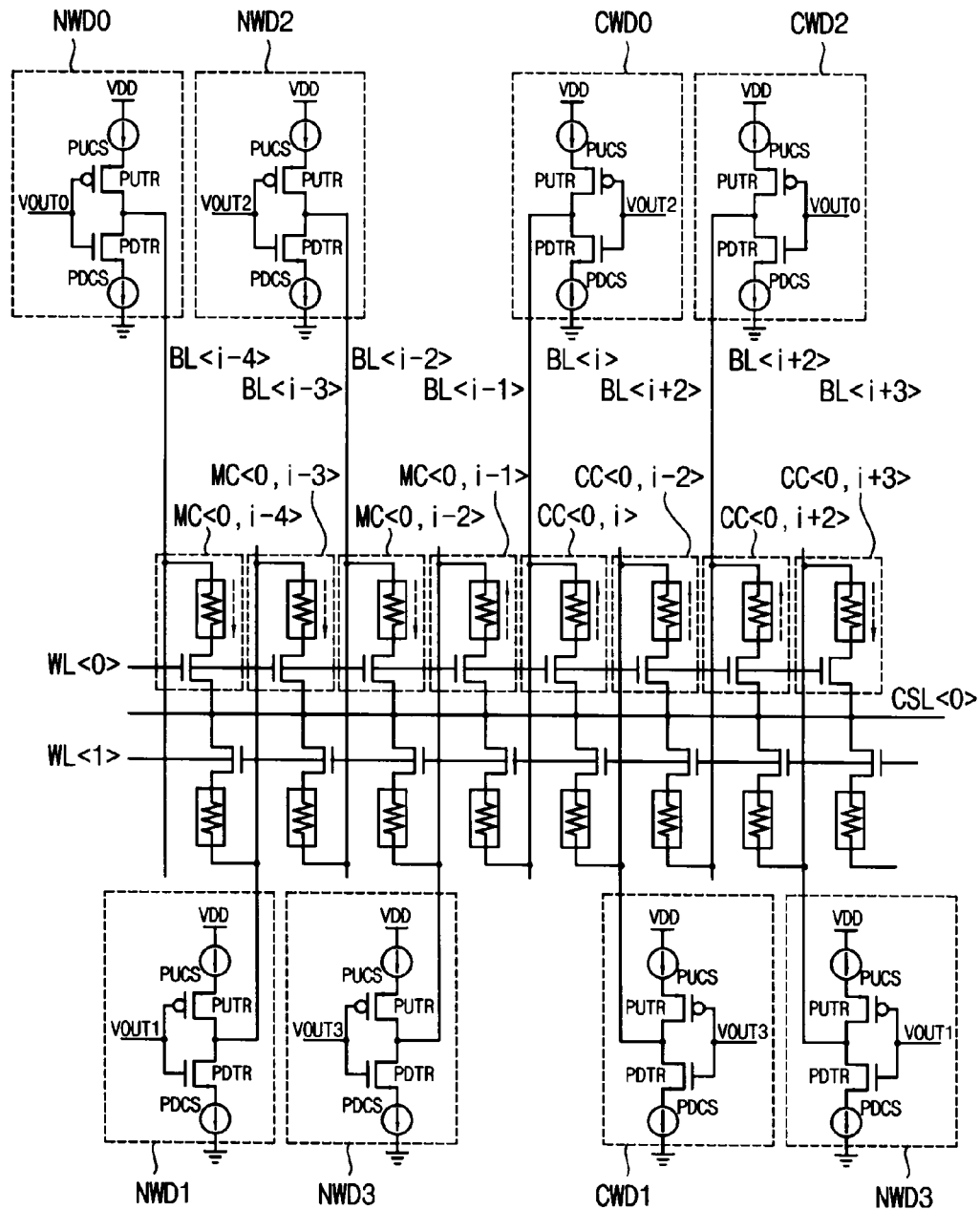
FIG. 8 is a circuit diagram to explain a common source line compensation operation when a data pattern is "0001" in a semiconductor memory device according to example embodiments.

FIG. 8 is a circuit diagram to explain a common source line compensation operation when a data pattern is "0001" in the semiconductor memory device according to example embodiments.

In FIG. 8, it is assumed that the word line WL<0> is selected by the row decoder 120, bit lines BL<i−4>, BL<i−3>, BL<i−2> and BL<i−1> are selected by the column decoder 130 and data "0001" are stored in the cell units MC<0, i−4>, MC<0, i−3>, MC<0, i−2> and MC<0, i−1>.

Referring to FIG. 8, "0001", which represents the state of the output signals VOUT0 to VOUT3 of the normal input buffer 140, is input into each input terminal of the normal write drivers NWD0 to NWD3 in response to data "0001". Thus, the pull up transistors PUTR of the normal write drivers NWD0 to NWD2 are turned on so that the write current is supplied from the pull up current source PUCS to the selected bit lines BL<i−4>, BL<i−3> and BL<i−2>. In addition, the pull down transistor PDTR of the normal write driver NWD3 is turned on so that the write current supplied from the selected bit line BL<i−1> is grounded. Thus, the write current may flow through each variable resistance memory element of the cell units MC<0, i−4>, MC<0, i−3>, and MC<0, i−2> in the direction indicated by an arrow (downward direction). As such, the write current flows from the bit line to the common source line, so the free layer is magnetized in the magnetization direction of the fixing layer. Therefore, the resistance value of the variable resistance memory element is set to a low value so that data "0" are stored. Meanwhile, the write current flows through the variable resistance memory element of the cell unit MC<0, i−1> in the direction indicated by an arrow (upward direction). As such, the write current flows from the common source line to the bit line, so the free layer is magnetized in the direction opposite to the magnetization direction of the fixing layer. Thus, the resistance value of the variable resistance memory element is set to a high value so that data "1" is stored.

When the common source line CSL<0> serves as a current combined node, three write currents are input into the node from the cell units MC<0, i−4>, MC<0, i−3> and MC<0, i−2> and one current is output to the cell unit MC<0, i−1> from the node. Therefore, the size of the current input into the common source line CSL may be imbalanced compared to the size of the current output from the common source line CSL according to the data pattern. Such an imbalance of the current size may cause the voltage level of the common source line to be biased from the state of ½VDD to the VDD direction or the ground direction. This imbalance of the current size may exert an influence on the magnetization direction of the memory element, so the write characteristic margin may be degraded.

In an example embodiment, the compensation input circuit 162 generates "1110" data in response to data "0001" to output the "1110" data to the compensation write circuit 164. Output signals VOUT0B, VOUT1B, VOUT2B and VOUT3B of the compensation input circuit 162 are input into the compensation write circuit 164. In addition, the pull down transistors PDTR of the compensation write drivers CWD0 to CWD2 are turned on in response to these signals, so the write current of the compensation bit lines BL<i>, BL<i+1> and BL<i+2> is sunken to the pull down current source PDCS. In addition, the pull up transistor PUTR of the compensation write driver CWD3 is turned on to supply the write current to the compensation bit lines BL<i+3>. Therefore, the write current may flow through each variable resistance memory element of compensation cell units CC<0, i>, CC<0, i+1> and MC<0, i+2> in the direction indicated by an arrow (upward direction). As such, the write current flows from the common source line to the bit line, so the free layer is magnetized in the direction opposite to the magnetization direction of the fixing layer. Thus, the resistance value of the variable resistance memory element is set to a high value so that data "1" are stored. Meanwhile, the write current flows through the variable resistance memory element of the compensation cell unit CC<0, i+3> in the direction indicated by an arrow (downward direction). As such, the write current flows from the bit line to the common source line, so the free layer is magnetized in the magnetization direction of the fixing layer. Therefore, the resistance value of the variable resistance memory element is set to a low value so that data "0" is stored.

Accordingly, when data "0001" is concurrently stored in four cell units, a total of four write currents of the cell units MC<0, i−4>, MC<0, i−3> and MC<0, i−2> and the compensation cell unit CC<0, i+3> are input into the common source line. Meanwhile, a total of four write currents of the cell unit MC<0, i−1> and the compensation cell units CC<0, i>, CC<0, i+1>, and MC<0, i+2> are output from the common source line.

Therefore, the size of the current input into the common source line may be balanced with the size of the current output from the common source line regardless of the data pattern, so the write and read error can be prevented.

Figure 9:
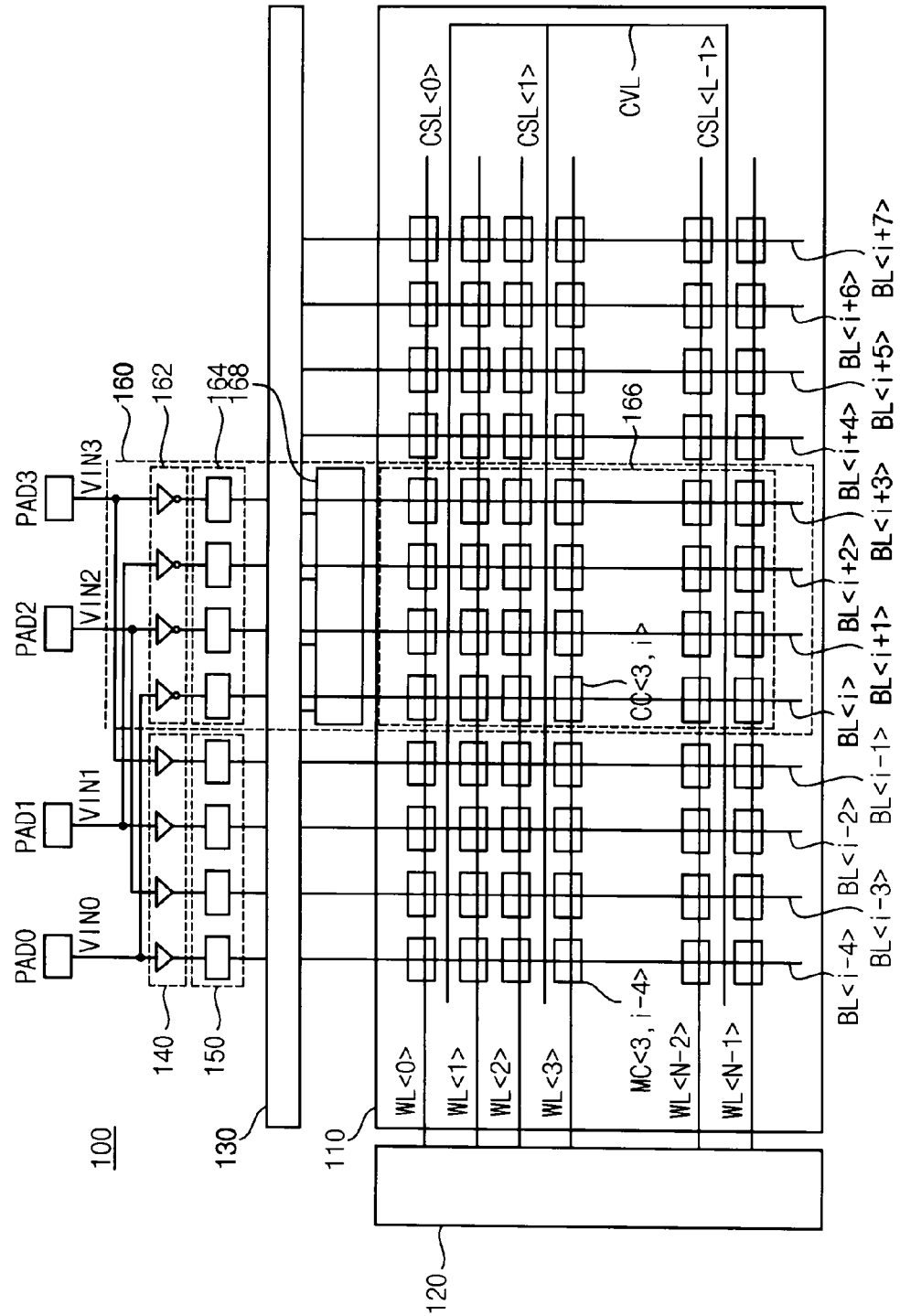
FIG. 9 is a block diagram illustrating a semiconductor memory device according to another example embodiment.

FIG. 9 is a block diagram illustrating a semiconductor memory device according to another example embodiment.

Another example embodiment of FIG. 9 is similar to the example embodiment of FIG. 1 except that a compensation mode selection circuit 168 is added to the common source line compensation circuit 160. Thus, the same reference numerals will be used to refer to the same elements and detailed description thereof will be omitted.

According to one example embodiment, some of normal cell units in the normal N*M size may be used as compensation cell units without additionally providing compensation cell units. This may be set using the compensation mode selection circuit 168, as described further below. For example, when the compensation mode is on, certain cell units are used as compensation cell units, and when the compensation mode is off, the same cell units are used as normal cell units. As such, certain cell units in the embodiment of FIG. 9 are configured to function as both normal cell units (e.g., when compensation mode is off) and as dummy, or compensation cell units (e.g., when compensation mode is on). Therefore, at times, the storage space actually usable by the user is N*(M−4), which accounts for the number of the compensation cell units. When the compensation mode is set, the memory controller may control the addressing only to the storage space of N*(M−4), which does not store data in the storage space defined by the compensation cell units.

Thus, the storage space may be slightly reduced in this example embodiment, but the noise removal function may be added by providing a simple circuit to a peripheral circuit area. In addition, the noise removal function may be selectively set by using a mode set register, so a system engineer can select the noise removal function using software.

Figure 10:
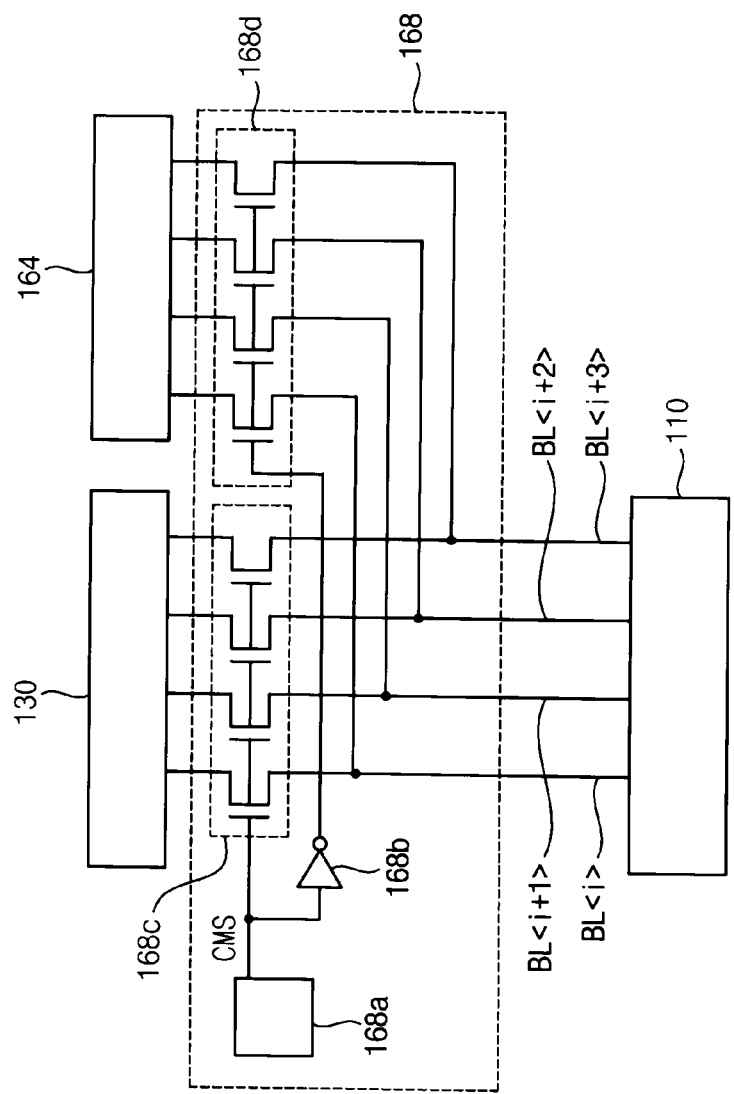
FIG. 10 is a circuit diagram illustrating a compensation mode selection circuit of FIG. 9 according to an example embodiment.

FIG. 10 is a circuit diagram illustrating the compensation mode selection circuit 168 of FIG. 9.

Referring to FIG. 10, the compensation mode selection circuit 168 includes a compensation mode set register 168a, an inverter 168b, a first selection switch 168c and a second selection switch 168d.

The compensation mode set register 168a receives the compensation mode selection signal from the outside to store a compensation mode set signal. According to one example embodiment, a normal mode setting state is represented if data "1" are stored in the register, and a compensation mode setting state is represented if data "0" are stored in the register. Therefore, the compensation mode set register 168a outputs a compensation mode selection signal CMS which is in a high state when the stored data are "1" and in a low state when the stored data are "0".

The first selection switch 168c includes four MOS transistors to switch the connection between the column decoder 130 and the bit lines BL<i>, BL<i+1>, BL<i+2>, and BL<i+3>. The four MOS transistors of the first selection switch 168c are turned on in response to the high state of the compensation mode selection signal CMS. For example, in the normal mode, the column decoder 130 is connected to the bit lines BL<i>, BL<i+1>, BL<i+2>, and BL<i+3> through the first selection switch 168c. Thus, if the bit lines BL<i>, BL<i+1>, BL<i+2>, and BL<i+3> are selected through the column decoder in the normal mode, the normal write circuit 140 supplies the write current.

The second selection switch 168d includes four MOS transistors to switch the connection between the compensation write circuit 164 and the bit lines BL<i>, BL<i+1>, BL<i+2>, and BL<i+3>. The four MOS transistors of the second selection switch 168d are turned on in response to the low state of the compensation mode selection signal CMS applied through the inverter 168b. Therefore, in the compensation mode, the compensation write circuit 164 is connected to the bit lines BL<i>, BL<i+1>, BL<i+2>, and BL<i+3> through the second selection switch 168d. Thus, in the compensation mode, the compensation write circuit 164 supplies the compensation write current to the bit lines BL<i>, BL<i+1>, BL<i+2>, and BL<i+3> in cooperation with the normal write circuit 140.

As a result of the compensation mode selection circuit 168, the memory device is configured to apply a current resulting from outputs of the compensation input buffer to the common source line, wherein the current balances a current concurrently applied to the common source line by the normal input buffer. In this case, the cell units to which the compensation input buffer outputs data become compensation cell units, or dummy cell units. However, the memory device in this embodiment is further configured to use the cell units to which the compensation input buffer corresponds as normal cell units, for example when the compensation mode is not selected.

Figure 11:
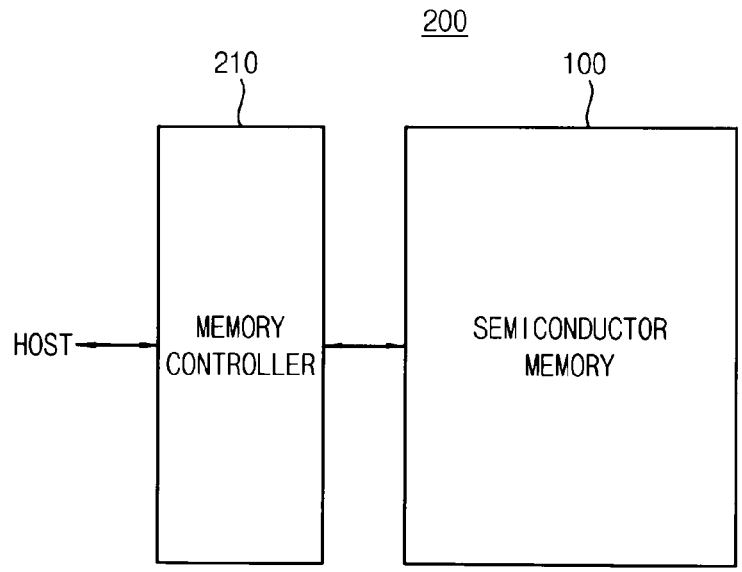
FIG. 11 is a block diagram illustrating a memory system including a semiconductor memory device of FIG. 1.

FIG. 11 is a block diagram illustrating the memory system 200 including the semiconductor memory device 100 of FIG. 1, according to one exemplary embodiment.

Referring to FIG. 11, the memory system 200 includes the semiconductor memory device 100 and the memory controller 210.

The memory controller 210 is connected to a host and the semiconductor memory device 100. The memory controller 210 accesses the semiconductor memory device 100 in response to the request of the host. For instance, the memory controller 210 controls the read, write and erase operations of the semiconductor memory device 100 in response to the request of the host. The memory controller 210 controls the operations of the semiconductor memory device 100. The memory controller 210 provides an interface between the semiconductor memory device 100 and the host. In one embodiment, the memory controller 210 drives a firmware to control the semiconductor memory device 100.

The memory controller 210 provides a control signal CTRL and an address ADDR to the semiconductor memory device 100. In addition, the memory controller 210 exchanges data with the semiconductor memory device 100. The memory controller 210 may include, for example, a RAM, a processing unit, a host interface, and a memory interface, which are generally known in the art. The RAM may be used as at least one of a working memory of the processing unit, a cache memory between the semiconductor memory device 100 and the host, and a buffer memory between the semiconductor memory device 100 and the host. The processing unit controls the overall operations of the memory controller.

The host interface may include a protocol for data exchange between the host and the memory controller 210. The memory controller 210 makes communication with the external device (host) through at least one of various interface protocols, such as USB (Universal Serial Bus), MMC (multimedia card), PCI (peripheral component interconnection), PCI-E (PCI-express), ATA (Advanced Technology Attachment), Serial-ATA, Parallel-ATA, SCSI (small computer small interface), ESDI (enhanced small disk interface), IDE (Integrated Drive Electronics), Firewire, and PCMCIA (Personal Computer Memory Card International Association) protocols. The memory interface is interfaced with the semiconductor memory device 100.

The memory system 200 may further include an error correction block. The error correction block detects and corrects the data error read from the semiconductor memory device 100 by using an error correction code (ECC). The error correction block serves as a component of the memory controller 210. The error correction block may serve as a component of the semiconductor memory device 100.

The memory controller 210 and the semiconductor memory device 100 may be integrated as one semiconductor chip. For example, in one embodiment, the memory controller 210 and the semiconductor memory device 100 are integrated as one semiconductor chip to constitute a memory card. For instance, the memory controller 210 and the semiconductor memory device 100 may be integrated as one semiconductor device to constitute a memory card, such as a PC card (PCMCIA, personal computer memory card international association), a smart media card (SM or SMC), a memory stick card, a multimedia card (MMC, RS-MMC or MMCmicro), or an SD card (SD, miniSD, microSD or SDHC).

In another embodiment, the memory controller 210 and the semiconductor memory device 100 are integrated as one semiconductor device to constitute a semiconductor drive (SSD, Solid State Drive). The semiconductor drive SSD includes a storage device to store data in a semiconductor memory. If the memory system 200 is used as the semiconductor drive SSD, the operating speed of the host connected to the memory system 200 can be remarkably improved.

In addition, the memory system 200 may serve as one of various components of a computer, a UMPC (Ultra Mobile PC), a workstation, a net-book, a PDA (Personal Digital Assistants), a portable computer, a tablet computer, a web tablet, a wireless phone, a mobile phone, a smart phone, an e-book, a PMP (portable multimedia player), a portable game player, a navigation device, a black box, a digital camera, a DMB (Digital Multimedia Broadcasting) player, a digital recorder, a digital audio player, a digital picture recorder, a digital picture player, a digital video recorder, a digital video player, a radio transceiver, an electronic device of a home network, an electronic device of a computer network, an electronic device of a telematics network, an RFID device, and a computing system.

The semiconductor memory device 100 and/or the memory controller 210 can be packaged in various forms. For instance, the semiconductor memory device 100 and/or the memory controller 210 can be packaged through various package schemes, such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 12:
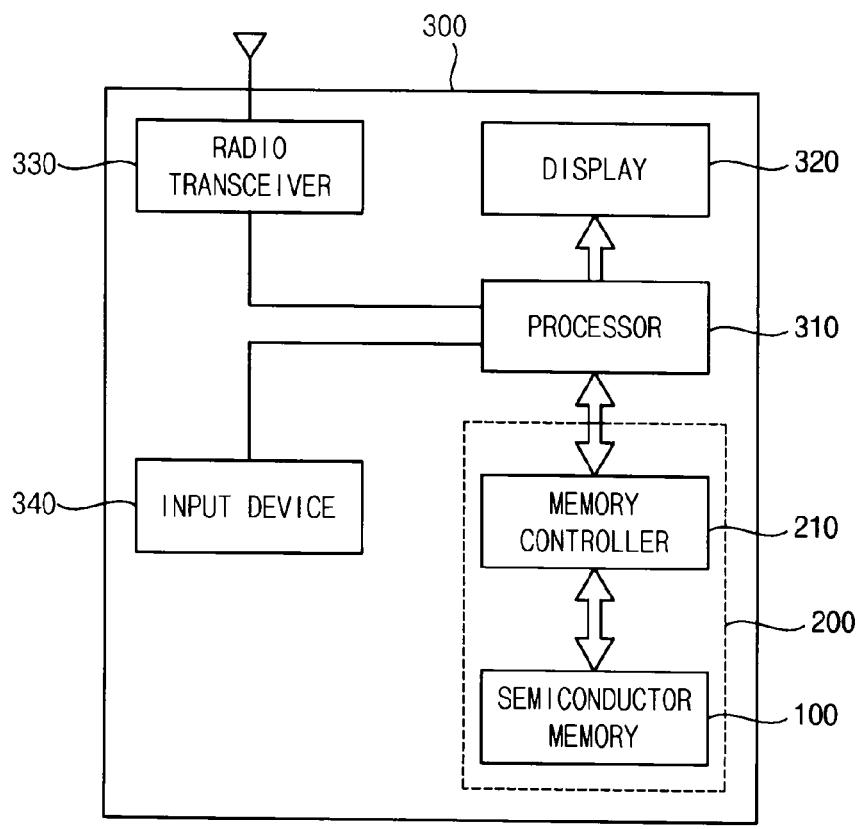
FIG. 12 is a block diagram illustrating an electronic apparatus including a memory system of FIG. 11 according to an example embodiment.

FIG. 12 is a block diagram illustrating an electronic apparatus including the memory system 200 of FIG. 11 according to an example embodiment.

Referring to FIG. 12, the electronic apparatus, which can be implemented as a cellular phone, a smart phone, or a wireless internet device, may include the semiconductor memory device 100 and the memory controller 210 capable of controlling the operation of the semiconductor memory device 100. In addition, the memory controller 210 is controlled by a host processor 310 that controls the overall operation of the electronic apparatus 300. The memory controller 210 can safely and concurrently store, for example, X4, X8, X16 or X32 data in the semiconductor memory device 100 by performing the writing operation through the common source line noise removal scheme described herein. The data stored in the semiconductor memory device 100 can be displayed on a display 320 under the control of the host processor 310.

A radio transceiver 330 may transceive radio signals through an antenna ANT. For instance, the radio transceiver 330 can convert the radio signals received through the antenna ANT into signals to be processed by the host processor 310. Thus, the host processor 310 can process the signals output from the radio transceiver 330 and can store the processed signals in the semiconductor memory device 100 or display the processed signals through the display 320. Further, the radio transceiver 330 can convert the signals output from the host processor 310 into the radio signals and output the converted radio signals to the outside through the antenna ANT.

An input device 340 can be used to input control signals to control the operation of the host processor 310 or data to be processed by the host processor 310. The input device 340 may be implemented as a pointing device, such as a touch pad or a computer mouse, a keypad or a keyboard.

The host processor 310 may control the operation of the display 320 such that the data output from the semiconductor memory device 100, the radio signals output from the radio transceiver 330 or the data output from the input device 340 can be displayed through the display 320.

Figure 13:
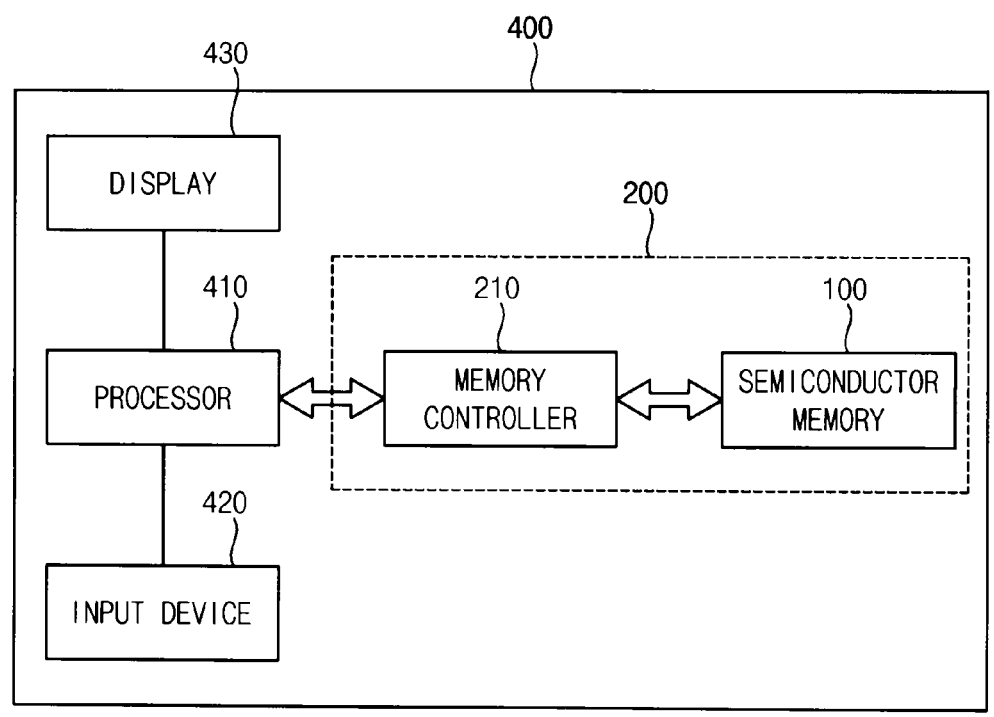
FIG. 13 is a block diagram illustrating an electronic apparatus including a memory system of FIG. 11 according to another example embodiment.

FIG. 13 is a block diagram illustrating an electronic apparatus including the memory system 200 of FIG. 11 according to another example embodiment.

Referring to FIG. 13, the electronic apparatus, which can be implemented as a data processing device, such as a PC (personal computer), a tablet computer, a net-book, an e-reader, a PDA (personal digital assistant), a PMP (portable multimedia player), an MP3 player or an MP4 player, includes the semiconductor memory device 100 and the memory controller 210 capable of controlling the operation of the semiconductor memory device 100.

In addition, the electronic apparatus 400 may include a host processor 410 that controls the overall operation of the electronic apparatus 400. The memory controller 210 is controlled by the host processor 410 that controls the overall operation of the electronic apparatus 400. The memory controller 210 can safely and concurrently store, for example, X4, X8, X16 or X32 data in the semiconductor memory device 100 by performing the writing operation through the common source line noise removal scheme described herein. The host processor 410 can display data stored in the semiconductor memory device 100 through a display 430 according to the input signal from an input device 420. For instance, the input device 420 may be implemented as a pointing device, such as a touch pad or a computer mouse, a keypad or a keyboard.

Figure 14:
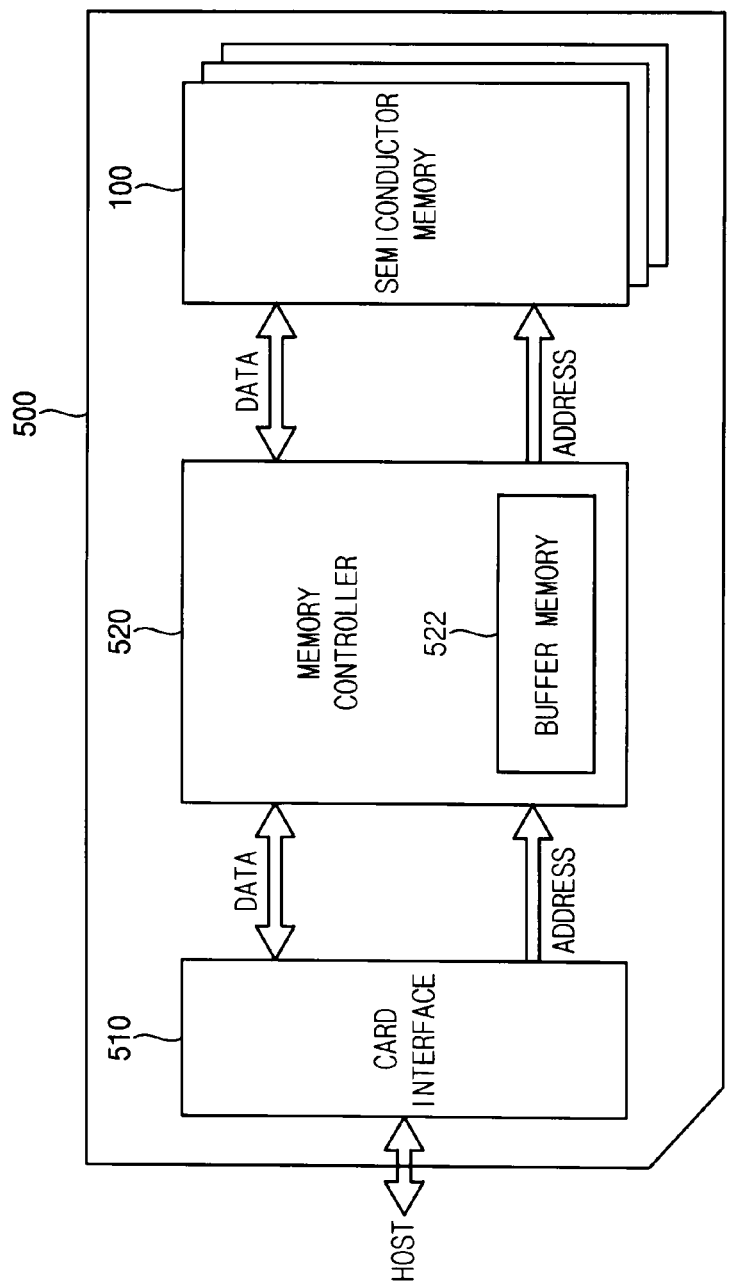
FIG. 14 is a block diagram illustrating an electronic apparatus including a memory system of FIG. 11 according to still another example embodiment.

FIG. 14 is a block diagram illustrating an electronic apparatus including the memory system of FIG. 11 according to still another example embodiment.

Referring to FIG. 14, the electronic apparatus 500 includes a card interface 510, a memory controller 520 and the semiconductor memory device 100 of FIG. 1.

The electronic apparatus 500 can transceive data with the host through the card interface 510. According to one example embodiment, the card interface 510 may be an SD (secure digital) card interface or an MMC (multi-media card) interface, but the example embodiment is not limited thereto. The card interface 510 may interface the data exchange between the host and the memory controller 520 according to the communication protocol of the host enabling communication with the electronic apparatus 500.

The memory controller 520 controls the overall operation of the electronic apparatus 500 and controls the data exchange between the card interface 510 and the semiconductor memory device 100. In addition, a buffer memory 522 of the memory controller 520 may buffer the data transceived between the card interface 510 and the semiconductor memory device 100. The memory controller 520 is connected to the card interface 510 and the semiconductor memory device 100 through a data bus DATA and an address bus ADDRESS. According to one example embodiment, the memory controller 520 receives the address of data to be read or written from the card interface 510 through the address bus ADDRESS and transfers the address of data to the semiconductor memory device 100.

In addition, the memory controller 520 transceives data to be read or written through the data bus DATA connected to the card interface 510 or the semiconductor memory device 100. According to one example embodiment, the memory controller 520 shown in FIG. 14 may perform functions identical to or similar to functions of the memory controller 210 shown in FIG. 11. Thus, the memory controller 520 can safely and concurrently store X4, X8, X16 or X32 data in the semiconductor memory device 100 by performing the writing operation through the common source line noise removal scheme described herein.

When the electronic apparatus 500 of FIG. 14 is connected to the host, such as a computer, a digital camera, a digital audio player, a mobile phone, a console video game hardware or a digital set-top box, the host may transceive the data stored in the semiconductor memory device 100 through the card interface 510 and the memory controller 520.

Figure 15:
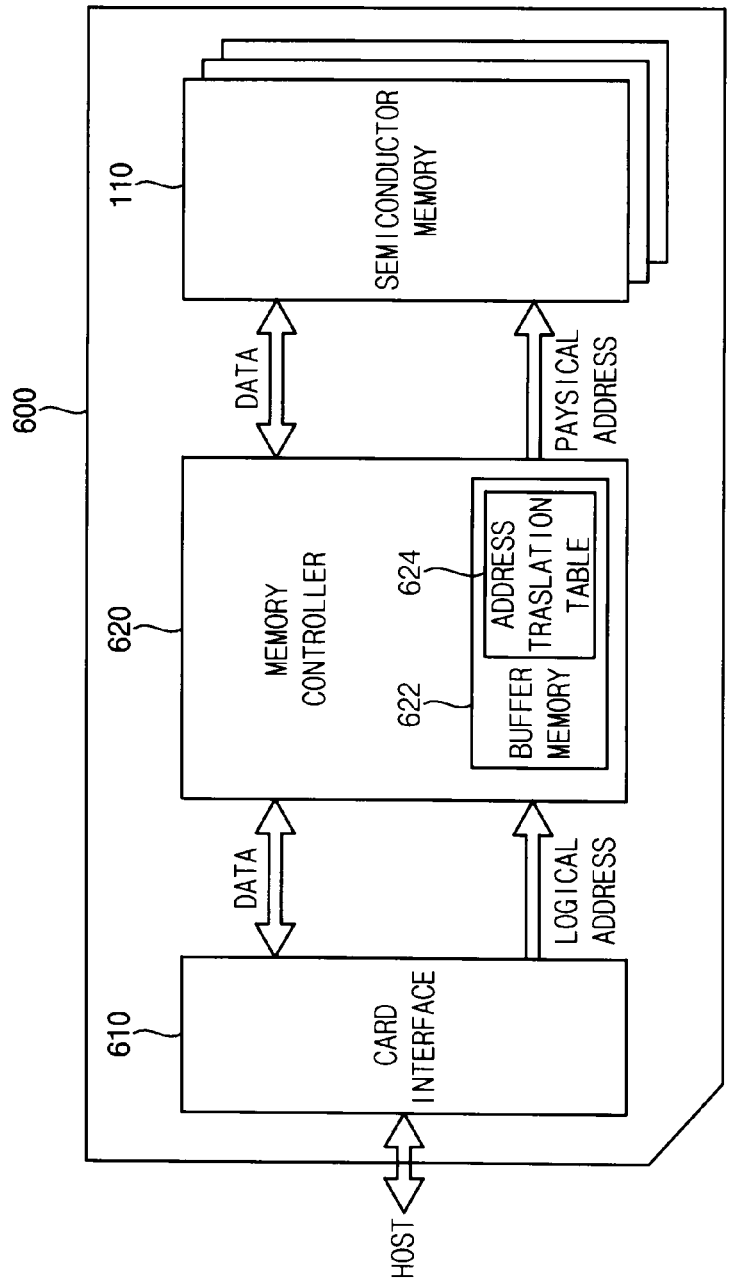
FIG. 15 is a block diagram illustrating an electronic apparatus including a memory system of FIG. 11 according to still yet another example embodiment.

FIG. 15 is a block diagram illustrating an electronic apparatus including the memory system of FIG. 11 according to still yet another example embodiment.

Referring to FIG. 15, the electronic apparatus 600 includes a card interface 610, a memory controller 620 and the semiconductor memory device 100 of FIG. 1.

The electronic apparatus 600 can make data communication with the host through the card interface 610. According to one example embodiment, the card interface 610 may be an SD (secure digital) card interface or an MMC (multi-media card) interface, but this example embodiment is not limited thereto. The card interface 610 can make data communication between the host and the memory controller 620 according to the communication protocol of the host enabling communication with the electronic apparatus 600.

The memory controller 620 controls the overall operation of the electronic apparatus 600 and controls the data exchange between the card interface 610 and the semiconductor memory device 100.

In addition, a buffer memory 622 of the memory controller 620 may store various data to control the overall operation of the electronic apparatus 600. The memory controller 620 may be connected to the card interface 610 and the semiconductor memory device 100 through a data bus DATA and a logical address bus LOGICAL ADDRESS. According to the example embodiment, the memory controller 620 receives the address of data to be read or written from the card interface 610 through the logical address bus LOGICAL ADDRESS and transfers the address of data to the semiconductor memory device 100 through a physical address bus PHYSICAL ADDRESS.

In addition, the memory controller 620 may transceive data to be read or written through the data bus DATA connected to the card interface 610 or the semiconductor memory device 100. The memory controller 620 may perform functions identical to or similar to functions of the memory controller 210 shown in FIG. 11. Thus, the memory controller 620 can safely and concurrently store X4, X8, X16 or X32 data in the semiconductor memory device 100 by performing the writing operation through the common source line noise removal scheme described herein.

When the electronic apparatus 600 of FIG. 15 is connected to the host, such as a computer, a digital camera, a digital audio player, a mobile phone, a console video game hardware or a digital set-top box, the host may transceive the data stored in the semiconductor memory device 100 through the card interface 610 and the memory controller 620.

Figure 16:
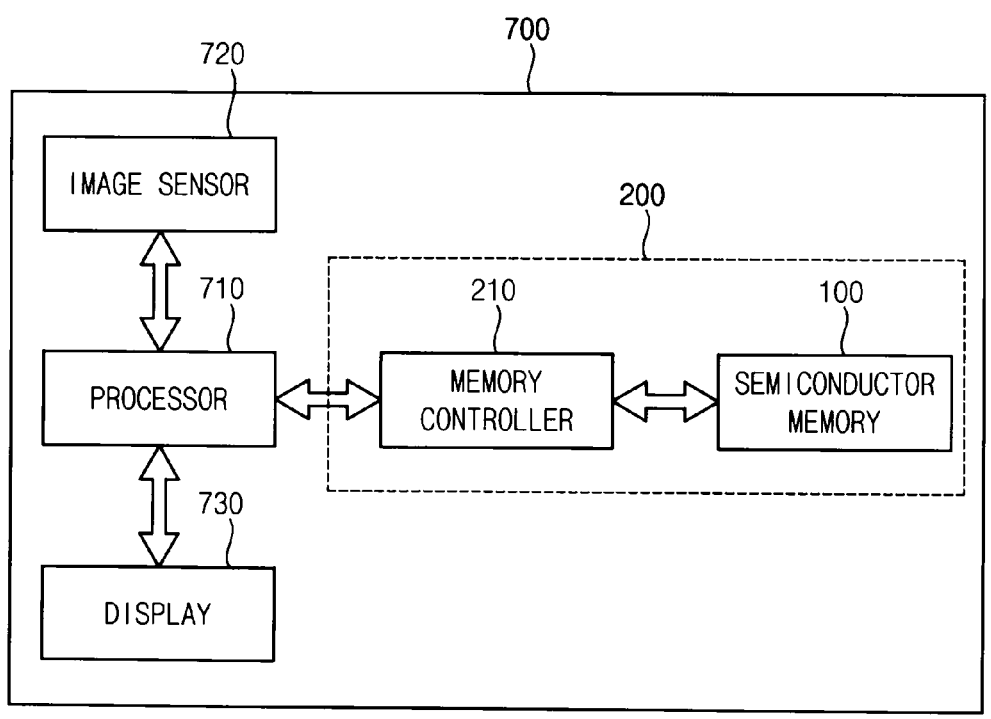
FIG. 16 is a block diagram illustrating an electronic apparatus including a memory system of FIG. 11 according to still yet another example embodiment.

FIG. 16 is a block diagram illustrating an electronic apparatus including the memory system 200 of FIG. 11 according to still yet another example embodiment.

Referring to FIG. 16, the electronic apparatus 700 includes the semiconductor memory device 100, the memory controller 210 to control the data processing operation of the semiconductor memory device 100 and a processor 710 capable of controlling the overall operation of the electronic apparatus 700. The memory controller 210 can safely and concurrently store, for example, X4, X8, X16 or X32 data in the semiconductor memory device 100 by performing the writing operation through the common source line noise removal scheme described herein.

An image sensor 720 of the electronic apparatus 700 converts an optical image into digital signals and the converted digital signals are stored in the semiconductor memory device 100 or displayed on a display 730 under the control of the host processor 710. In addition, the digital signals stored in the semiconductor memory device 100 are displayed on the display 730 under the control of the host processor 710.

The foregoing is illustrative of the present disclosed embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, modifications to the disclosed example embodiments, as well as other example embodiments, are intended to be included within the scope of the appended claims.

What is claimed is:

1. A semiconductor memory device comprising:
   a cell array including a plurality of normal cell units connected between a plurality of bit lines and one common source line, respectively, the plurality of normal cell units configured to receive a plurality of respective bits from the plurality of bit lines; and
   a common source line compensation circuit configured to supply a plurality of compensation write currents to the common source line to compensate for a plurality of write currents concurrently input into or output from the common source line through the normal cell units,
   wherein the plurality of write currents correspond to the plurality of bits,
   wherein the common source line compensation circuit is configured to invert the plurality of bits, and
   wherein the plurality of compensation write currents are reverse currents respectively corresponding to the plurality of write currents.

2. The semiconductor memory device of claim 1, wherein the common source line compensation circuit comprises:
   a compensation input buffer configured to invert input write data supplied from an outside;
   a compensation write circuit configured to concurrently supply the compensation write currents, which correspond to each bit value of the write data inverted through the compensation input buffer, to corresponding compensation bit lines; and
   a plurality of compensation cell units disposed in an area of the cell array and connected between the compensation bit lines and the common source line, respectively, to concurrently store data corresponding to the compensation write currents.

3. The semiconductor memory device of claim 2, wherein the write data has a bit number of 2 square including x2, x4, x8, x32, x64 or x128.

4. The semiconductor memory device of claim 2, wherein each cell unit of the normal cell units and of the compensation cell units comprises a variable resistance memory element and a cell access transistor serially connected between a corresponding bit line and the common source line.

5. The semiconductor memory device of claim 4, wherein the variable resistance memory element comprises an STT-MTJ (Magnetic Tunnel Junction) memory element where data are recorded by an STT (Spin Transfer Torque).

6. The semiconductor memory device of claim 2, wherein a normal input buffer and the compensation input buffer to input the write data comprise a plurality of pseudo differential amplifiers, respectively.

7. The semiconductor memory device of claim 2, wherein the compensation cell units comprise dummy cell units dedicated for use as compensation cell units.

8. The semiconductor memory device of claim 2, wherein the compensation cell units are formed by a part of the normal cell units, such that they are configured for use as compensation cell units and as normal cell units.

9. The semiconductor memory device of claim 8, further comprising a compensation mode selection circuit between the compensation write circuit and the compensation bit lines,
wherein the compensation mode selection circuit selectively supplies a normal write current and the compensation write current to the compensation cell units through a column decoder, which is used to select the compensation bit lines, in response to a compensation mode selection signal.

10. The semiconductor memory device of claim 9, wherein the compensation mode selection circuit comprises:
a compensation mode set register configured to store a compensation mode set signal and to generate a compensation mode selection signal;
an inverter configured to invert the compensation mode selection signal;
a first selection switch connected between the column decoder and the compensation bit lines and turned on in a normal mode in response to the compensation mode selection signal; and
a second selection switch connected between the compensation write circuit and the compensation bit lines and turned on in a compensation mode in response to an output signal of the inverter.

11. A semiconductor memory device comprising:
a row decoder configured to select one of a plurality of word lines;
a column decoder configured to concurrently select bit lines corresponding to n-bit data, n being an integer greater than 1;
a cell array including respective cells disposed at respective intersections between the word lines and the bit lines and including a plurality of normal cell units connected between a corresponding bit line and one common source line, respectively;
a normal input buffer configured to input the n-bit data;
a normal write circuit configured to drive bit lines of a column selected by the column decoder with a corresponding write current in response to a data pattern input into the normal input buffer; and
a common source line compensation circuit configured to supply a plurality of compensation write currents to the common source line to compensate for a plurality of write currents concurrently input into or output from the common source line through the normal cell units concurrently driven through the normal write circuit by inputting the n bit data,
wherein the common source line compensation circuit comprises:
a compensation input buffer configured to invert the n-bit data and output the inverted n-bit data;
a compensation write circuit configured to concurrently supply the compensation write currents, which correspond to each bit value of the n-bit data inverted through the compensation input buffer, to corresponding compensation bit lines; and
a plurality of compensation cell units disposed in an area of the cell array and connected between the compensation bit lines and the common source line, respectively, to concurrently store data corresponding to the compensation write currents.

12. The semiconductor memory device of claim 11, further comprising a compensation mode selection circuit between the compensation write circuit and the compensation bit lines,
wherein the compensation mode selection circuit selectively supplies a normal write current and the compensation write current to the compensation cell units through a column decoder, which is used to select the compensation bit lines, in response to a compensation mode selection signal.

13. The semiconductor memory device of claim 12, wherein the compensation mode selection circuit comprises:
a compensation mode set register configured to store a compensation mode set signal and to generate a compensation mode selection signal;
an inverter configured to invert the compensation mode selection signal;
a first selection switch connected between the column decoder and the compensation bit lines and turned on in a normal mode in response to the compensation mode selection signal; and
a second selection switch connected between the compensation write circuit and the compensation bit lines and turned on in a compensation mode in response to an output signal of the inverter.

14. The semiconductor memory device of claim 11, wherein each of the normal cell units and the compensation cell units comprises a variable resistance memory element and a cell access transistor serially connected between a corresponding bit line and the common source line, and the variable resistance memory element comprises an STT-MTJ (Magnetic Tunnel Junction) memory element where data are recorded by an STT (Spin Transfer Torque).

15. A magnetic random access memory (MRAM) device, comprising:
a memory cell array including a plurality of cell units arranged in rows and columns;
a plurality of first buffer circuits, each first buffer circuit coupled between a pad of the MRAM device and a common source line and corresponding to a set of cell units of the plurality of cell units; and
a plurality of second buffer circuits, each second buffer circuit coupled between a pad of the MRAM device and the common source line and corresponding to a set of cell units of the plurality of cell units,
wherein the MRAM device is configured to apply a current resulting from outputs of the plurality of second buffer circuits to the common source line, wherein the current balances a current concurrently applied to the common source line by the plurality of first buffer circuits.

16. The MRAM device of claim 15, wherein:
the plurality of first buffer circuits are connected to the same respective pads as the plurality of second buffer circuits; and
the plurality of first buffer circuits are configured to output a first set of data, and the plurality of second buffer circuits are configured to output a second set of data that is an inverse of the first set of data.

17. The MRAM device of claim 15, wherein:
the sets of cell units that correspond to the plurality of first buffer circuits include normal memory cell units; and
the sets of cell units that correspond to the plurality of second buffer circuits are configured function as either normal memory cell units or compensation cell units.

18. The MRAM device of claim 17, further comprising:
a mode selection circuit between the plurality of second buffer circuits and the common source line, wherein
the mode selection circuit is configured to select between setting the sets of cell units that correspond to the plurality of second buffer circuits as normal memory cell units, and setting the sets of cell units that correspond to the plurality of second buffer circuits as compensation cell units.

19. The MRAM device of claim 18, wherein:
each of the normal memory cell units and the compensation cell units comprises a variable resistance memory element and a cell access transistor serially connected between a corresponding bit line and the common source line, and the variable resistance memory element comprises an STT-MTJ (Magnetic Tunnel Junction) memory element where data are recorded by an STT (Spin Transfer Torque).

* * * * *